United States Patent [19]

Endo et al.

[11] Patent Number: 5,047,311
[45] Date of Patent: Sep. 10, 1991

[54] PANCHROMATIC SILVER HALIDE PHOTOGRAPHIC ELEMENT

[75] Inventors: Kazunaka Endo; Kyonosuke Yammamoto; Eiji Kanada; Shigeyoshi Suzuki, all of Nagaokakyo, Japan

[73] Assignee: Mitsubishi Paper Mills Ltd., Tokyo, Japan

[21] Appl. No.: 18,722

[22] Filed: Feb. 24, 1987

Related U.S. Application Data

[63] Continuation of Ser. No. 738,473, May 28, 1985, abandoned.

[30] Foreign Application Priority Data

May 29, 1984 [JP] Japan .............................. 59-109281
Jun. 26, 1984 [JP] Japan .............................. 59-132278

[51] Int. Cl.$^5$ .............................................. G03C 5/54
[52] U.S. Cl. .................................... 430/204; 430/230; 430/574; 101/463.1
[58] Field of Search ............... 430/204, 230, 229, 246, 430/574, 583, 576, 244

[56] References Cited

U.S. PATENT DOCUMENTS

| | | | |
|---|---|---|---|
| 3,220,837 | 11/1965 | Land et al. .......................... | 430/204 |
| 3,776,728 | 12/1973 | Suzuki et al. ....................... | 430/204 |
| 3,847,613 | 11/1974 | Sakazume et al. .................., | 430/583 |
| 3,986,878 | 10/1976 | Hinata et al. ........................ | 430/574 |
| 4,018,610 | 4/1977 | Hinata et al. ........................ | 430/574 |
| 4,134,769 | 1/1979 | Yoshida et al. ...................... | 430/204 |
| 4,224,402 | 9/1980 | Vermeulen et al. ................. | 430/204 |
| 4,232,118 | 4/1980 | Okauchi et al. ..................... | 430/204 |
| 4,250,244 | 2/1981 | Borror et al. ........................ | 430/583 |
| 4,355,090 | 10/1982 | Yamada et al. ...................... | 430/204 |
| 4,469,785 | 9/1984 | Tanaka et al. ....................... | 430/574 |

Primary Examiner—Richard L. Schilling
Attorney, Agent, or Firm—Cushman, Darby & Cushman

[57] ABSTRACT

Disclosed is a panchromatic silver halide photographic emulsion for use in DTR process which exhibits a high sensitivity, especially to blue light, a high contrast and a high resolving power and a photographic element containing said silver halide emulsion layer. Said emulsion contains a blue-sensitizing dye represented by the general formula [I]:

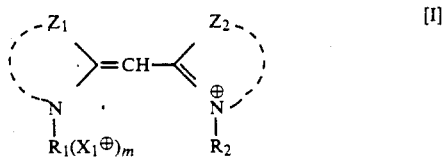

(wherein $Z_1$, $Z_2$, $R_1$, $R_2$, $X_1$ and m are as defined before).

Said emulsion may contain, as green- and red-sensitizing dyes, those represented by the general formula [II] and [III] to attain more effectively the objects:

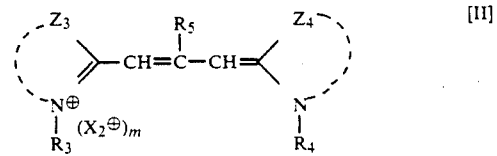

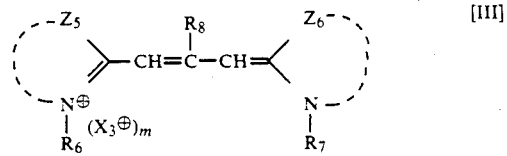

(wherein $Z_3$, $Z_4$, $Z_5$, $Z_6$, $R_3$, $R_4$, $R_5$, $R_6$, $R_7$, $R_8$, $X_2$, $X_3$ and m are as defined before).

Said photographic element is an excellent ligtographic printing plate.

7 Claims, No Drawings

PANCHROMATIC SILVER HALIDE PHOTOGRAPHIC ELEMENT

This is a continuation of application Ser. No. 738,473, filed May 28, 1985, which was abandoned upon the filing hereof.

This invention relates to spectral sensitization for a panchromatic photographic element suitable for the silver complex diffusion transfer process. More particularly, it relates to a silver halide panchromatic photographic emulsion in which sensitizing dyes to blue, green, and red are integrally adsorbed on silver halide grains.

The silver complex diffusion transfer process (hereinafter referred to as DTR process) is described in detail in A, Rott and E, Weyde "Photographic silver halide diffusion process.", Focal Press, London and New York, 1972. In this process, the silver complex is imagewise transferred by diffusion from the silver halide emulsion layer to an image receptive layer and converted therein into a silver image in the presence of development nuclei. For this purpose, the imagewise exposed silver halide emulsion layer is disposed in contact with the image receptive layer in the presence of a developing substance and a silver complexing agent to convert the unexposed silver halide into a soluble silver complex. In exposed areas of the silver halide emulsion layer, the silver halide is developed to silver which is insoluble and remains in the layer. The silver halide in unexposed areas is converted into a soluble silver complex, transferred to the image receptive layer, and forms silver image usually in the presence of development nuclei.

The DTR process is currently used in reproduction of documents such as, for example, technical drawings and printed matters as well as in making printing plate and in instant photography.

A lithographic printing plate utilizing as ink receptive area directly the transferred silver image formed by DTR process has already been described in Japanese Patent Publication No. 30,562/73, Japanese Patent Application "Kokai" (Laid-open) Nos. 21,602/78, 103,104/79, and 9,750/81 and is well known. In a typical embodiment of DTR process suitable for making such a printing plate, a photographic element comprising, in the order indicated, a support, a subbing layer which serves also as an antihalation layer, a silver halide emulsion layer, and a physical development nuclei layer is image-wise exposed and developed to convert the silver halide grains in the emulsion layer, upon which a latent image has been formed, into black grains of silver; at the same time, silver halide grains, upon which no latent image has been formed, become soluble by the action of a silver halide complexing agent contained in the developer, diffuses toward the surface and deposits in the form of silver image on the physical development nuclei in the surface layer by the reducing action of the developing agent. If necessary, the developing treatment is followed by sensitizing treatment to enhance the ink receptivity of the silver image. The printing plate thus obtained is mounted on an offset press and the inked image is transferred to a print medium.

In conventional photographic light-sensitive elements for making lithographic printing plate of the above type, the silver halide in the photosensitive layer is spectrally sensitized with a single merocyanine or cyanine dye so that the photographic element may show maximum sensitivity to the rays of about 550 nm and the photographic element is used in making a monochromatic printing plate. However, along with the recent tendency in the lithographic reproduction of color originals, the demand for the panchromatic photographic element has become stronger than that for the monochromatic type. Therefor, if a panchromatic photographic element excellent in sensitivity, sharpness, resolving power, and printing endurance is developed, it becomes possible to provide photographic elements capable of producing printing plates from a color original or reproducing the color original by the three-color separation in a process camera, which has been impossible with conventional photographic elements for lithography. Such panchromatic photographic elements can also be used as monochromatic ones similarly to the conventional lithographic photographic elements.

Conventional photomechanical processes for color printing are carried out in most cases by using a lith-type panchromatic photosensitive element. In this work, after a number of photographic treatments including the color separation of the color original and masking technique, the image is finally formed on a presensitized plate by contact printing from the lith film to prepare an offset master. An object of this invention is to provide a convenient panchromatic light-sensitive direct-printing material in lithography by simplifying the above complicated procedure.

In making printing plates by the DTR process from panchromatic light-sensitive material, it is desirable to form a halftone image in a process camera by exposure to three separated colors, respectively, through a contact screen and color separation filters. For this purpose, the panchromatic light-sensitive materials should be high in sensitivity, resolving power, contrast, sharpness, and printing endurance. Moreover, these characteristics of color plates including cyan, magenta, yellow, and black plates should be in comparable levels as far as possible; otherwise, there arise such problems as unsatisfactory color reproduction in the copies, too long a time of printing plate making, and reduced number of acceptable copies. In fact, no satisfactory panchromatic light-sensitive materials have been available up to the present for lithographic printing plate making. One of the reasons for this is such that in order to impart to the light-sensitive material sufficient sensitivity to green, red, and, if necessary, blue region (e.g. in the case of silver halide containing silver chloride as major constituent, as described hereinafter) of the spectrum, it is necessary to use a plurality of sensitizing dyes, resulting in an increase in the total amount of dyes for a given amount of silver chloride, which, in turn, interferes with the deposition of silver on the physical development nuclei, thereby to cause a decrease in printing endurance of the lithographic printing plate. Furthermore, the sensitizing dyes should be adsorbed to individual silver halide grains so that each light-sensitive material exhibits sufficiently high sensitivity and high contrast when exposed through corresponding filters for color separation; this is a difficult requirement to meet.

In a light-sensitive material for making printing plate by DTR process, there is usually used a silver halide emulsion containing silver chloride as major constituent to facilitate the diffusion of silver complex to the physical development nuclei layer and the deposition of silver in said layer. As known well, such an emulsion has an inherent sensitive region in shorter wavelength portion of the spectrum and has lower sensitivity as compared with an emulsion containing silver bromide or iodobromide as major constituent. As a consequence, the said former emulsion has an insufficient sensitivity to the rays passing through a blue separation filter and the color print obtained by use of such an emulsion cannot be said to be of sufficient color reproducibility.

U.S. Pat. No. 3,953,215 and 4,018,610 disclose silver halide emulsions containing a combination of sensitizing dyes comprising a green-sensitizing dye or/and a red-sensitizing dye and a blue-sensitizing dye. However, the attempts to obtain panchromatic light-sensitive materials convertible to printing plates by DTR process by using blue-sensitizsing dyes particularly disclosed by said patents were found unsuccessful in meeting the aforementioned requirements, as described in detail hereinafter.

In reproducing documents and printed matters as, for example, in the case of finish work necessary for making printing plates from the panchromatic light-sensitive material, it should be taken into account that the silver image formed in the image receptive layer must retain high levels of sharpness, contrast, and resolving power.

Therefore, if a panchromatic light-sensitive material excellent in density, contrast, and resolving power is developed, it becomes possible to provide light-sensitive materials capable of reproducing a color original by the three-color separation in a process camera, which has been impossible with conventional monochromatic light-sensitive materials. Such panchromatic materials can also be used as monochromatic ones in place of conventional monochromatic light-sensitive materials.

In color printing, as mentioned previously, use is generally made of a lith-type panchromatic light-sensitive material, because it is capable of manifesting high levels of sensitivity, contrast, and resolving power. Design features of the lith film to maintain such characteristics include (1) a silver halide content of the emulsion layer of more than 5 g/m² in terms of silver nitrate to maintain a high contrast and (2) the use of fresh lith developer (which manifests a high rate of reaction in the early period of the course of lith-type development, resulting in high contrast and high gamma) to maintain a high gamma value. Therefore, it is very useful if it is possible to develop a panchromatic light-sensitive material having a low silver content, which, upon development in a DRT developer of high stability, exhibits the characteristics comparable to those of a lith-type panchromatic light-sensitive material.

An object of this invention is to provide a silver halide photographic light-sensitive element for use in DTR process, which is panchromatically spectrally sensitized and exhibits a high sensitiveiy, especially to blue light, a high contrast, and a high resolving power; and also a method for the development of said photographic element.

Another object of this invention is to provide a panchromatically sensitized photographic element convertible to a lithographic printing plate by DTR process, which is characterized by high levels of sensitivity, contrast, and resolution, especially a high sensitivity to blue region of the spectrum and capability of producing a large number of color prints with excellent color reproducibility; and also a method of making a lithographic printing plate from said photographic element.

The object of this invention are achieved by a photographic element for use in DTR process, characterized by having a silver halide emulsion layer which contains at least 70 mole-% (based on total silver halide) of silver chloride and which is optically sensitized to blue, green, and red spectral regions, said sensitization to blue spectral region being performed with at least one of the sensitizing dyes represented by the following general formula; or by the DTR process using said photographic element:

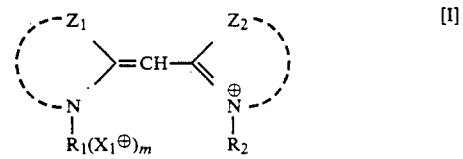

wherein $Z_1$ represents a group of atoms necessary for completing benzothiazole nucleus, benzoxazole nucleus, or benzoselenazole nucleus having a substituent at position 5 or/and 6; $Z_2$ represents a group of atoms necessary for completing a napthothiazole nucleus, naphthoselenazole nucleus, or napthoxazole nucleus, provided that $Z_1$ and $Z_2$ do not simultaneously form a benzoxazole nucleus and napthoxazole nucleus, respectively; $R_1$ and $R_2$ represent each a substituted or unsubstituted aliphatic group, at least one of $R_1$ and $R_2$ representing an aliphatic group having a sulfo group; $X_1$ represents a cation; and m represents 0 or 1. As typical examples of groups substituting at positions 5 and 6 of the nucleus involving $Z_1$, mention may be made of an alkyl group (preferably a lower alkyl group), alkoxy group (preferably a lower alkoxy group), halogen atom (e.g. chlorine, bromine, or iodine atom), aryl group (e.g. phenyl group), cyano group, alkoxycarbonyl group (preferably a lower alkoxycarbonyl group), carboxyl group, and heterocyclic groups (e.g. 2-thienyl group).

Typical examples of particular sensitizing dyes represented by the general formula [I] are as shown below:

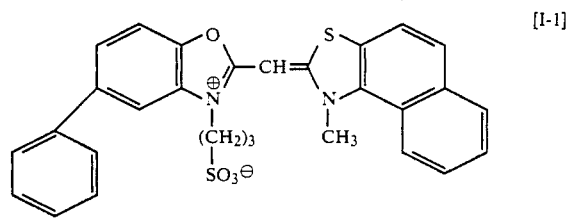

[I-1]

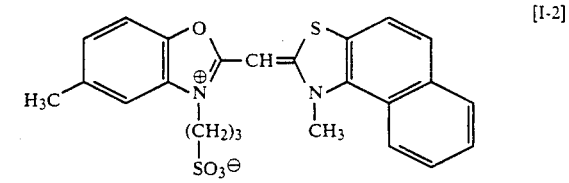

[I-2]

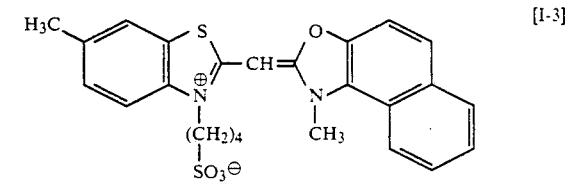

[I-3]

-continued
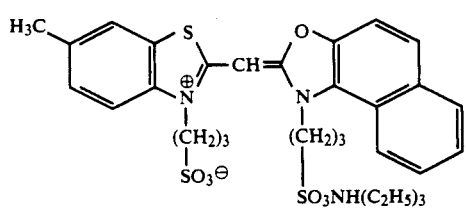 [I-4]
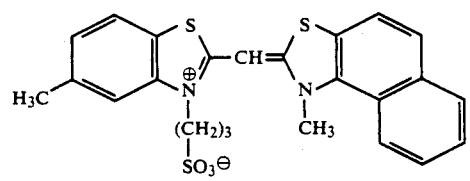 [I-5]
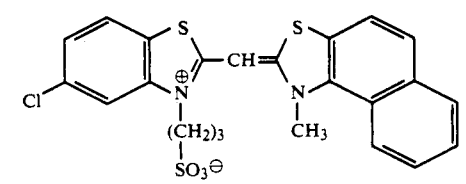 [I-6]
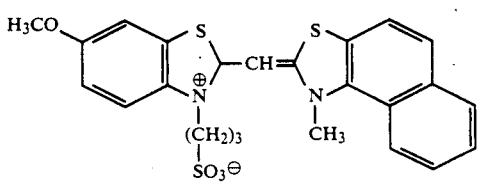 [I-7]
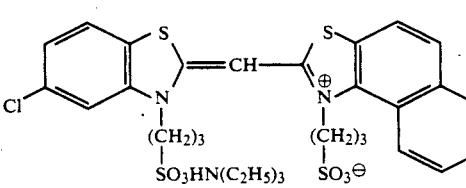 [I-8]
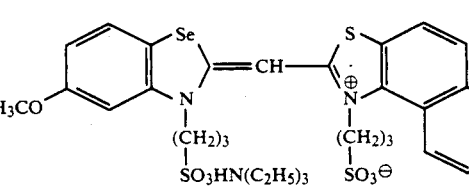 [I-9]
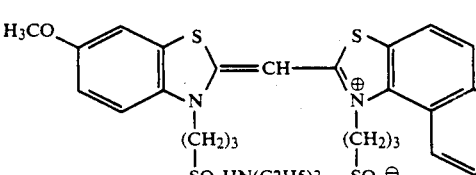 [I-10]
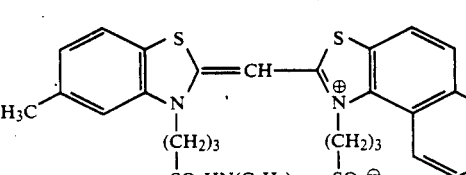 [I-11]
Sensitizing dyes used as reference:
-continued
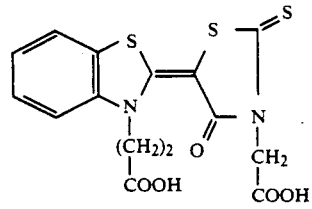 [I-A]
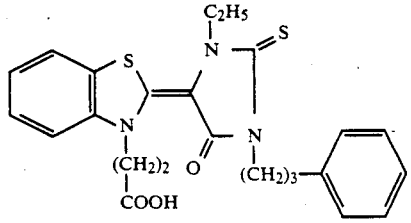 [I-B]
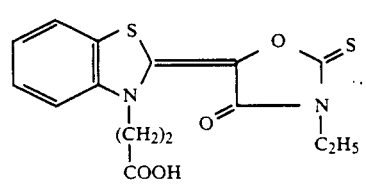 [I-C]
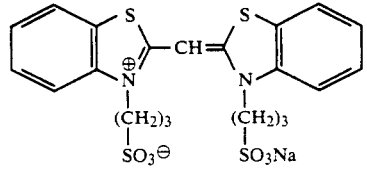 [I-D]
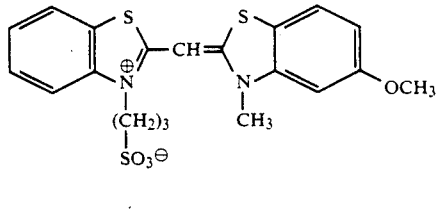 [I-E]
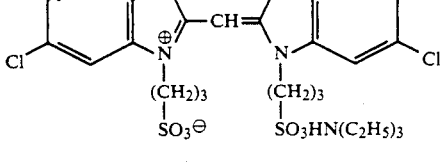 [I-F]
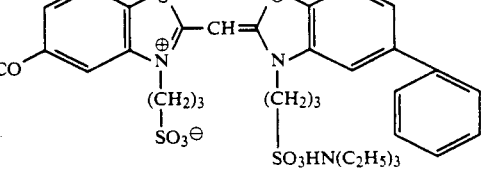 [I-G]
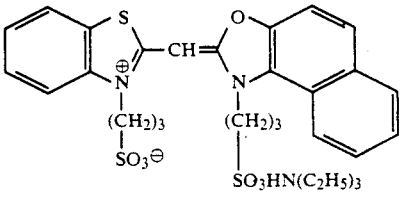 [I-H]

-continued

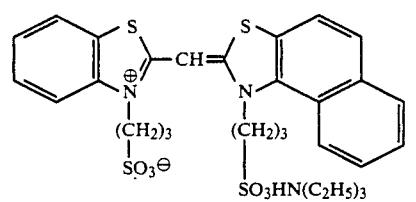
[I-I]

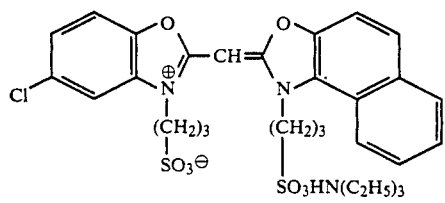
[I-J]

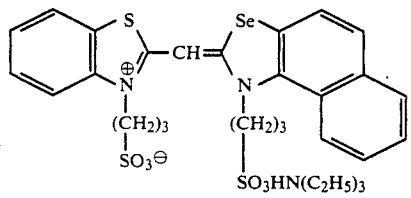
[I-K]

Other sensitizing dyes used in combination with those represented by the general formula [I] to sensitize panchromatically the emulsion can be selected from the known dyes. It is preferable to use the dyes of general formula [I] jointly with the sensitizing dyes which show a sensitivity maximum in green (500-600 nm) and red (600-700 nm) regions of the spectrum and are selected from the betaine-type or anion-type cyanine dyes described in U.S. Pat. No. 4,134,769.

It was further found that more effective way of achieving the objects of this invention is to use the green-sensitizing dyes and red-sensitizing dyes represented by the following general formulas [II] and [III], respectively.

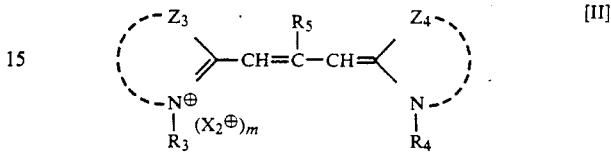
[II]

wherein $Z_3$ and $Z_4$ represent groups of atoms necessary to complete benzoxazole nucleus or naphthoxazole nucleus; $R_3$ and $R_4$ represent each a substituted or unsubstituted aliphatic or aromatic group, at least one of $R_3$ and $R_4$ being a group having a sulfo group; $R_5$ represents a hydrogen atom, alkyl group, aryl group, or aralkyl group; $X_2$ represents a cation; and m represents 0 or 1.

Typical examples of the sensitizing dyes represented by the general formula [II] are shown below.

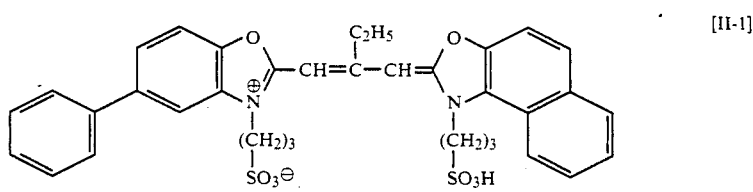
[II-1]

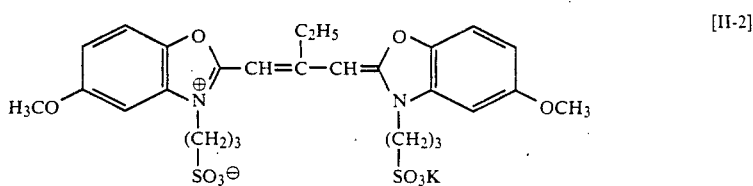
[II-2]

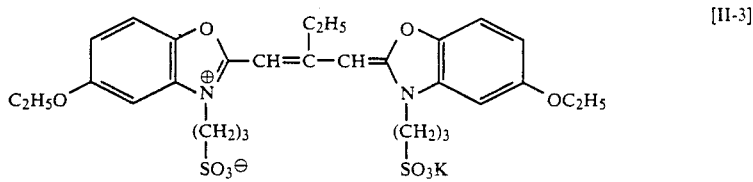
[II-3]

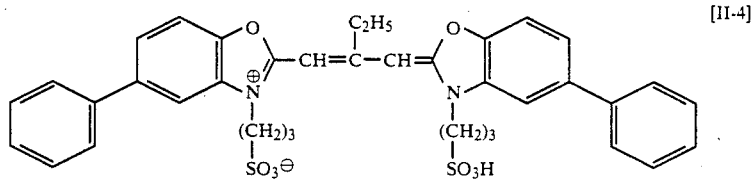
[II-4]

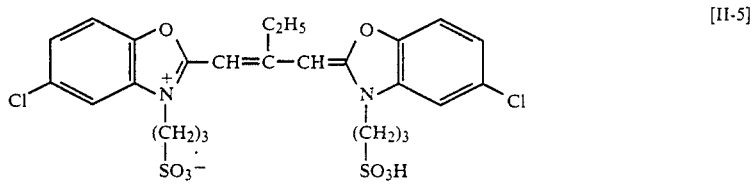
[II-5]

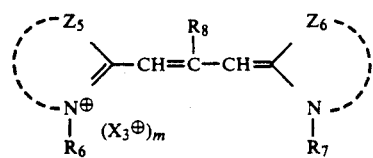
[III]

wherein $Z_5$ and $Z_6$ each represents a group of atoms necessary to complete a benzothiazole nucleus, benzoselenazole nucleus, naphthothiazole nucleus, or naphthoselenazole nucleus; $R_6$ and $R_7$ represent each an unsubstituted or substituted aliphatic group or aromatic group, at least one of $R_6$ and $R_7$ being a group having a sulfo group; $R_8$ represents a hydrogen atom, an alkyl group, aryl group, or aralkyl group; $X_3$ represents a cation; and m represents 0 or 1.

Typical examples of the sensitizing dyes represented by the general formula [III] are shown below.

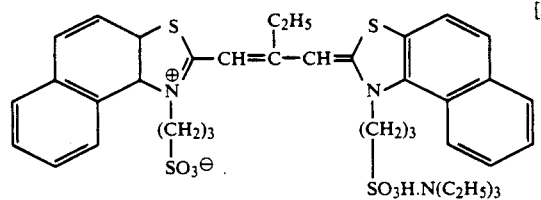
[III-1]

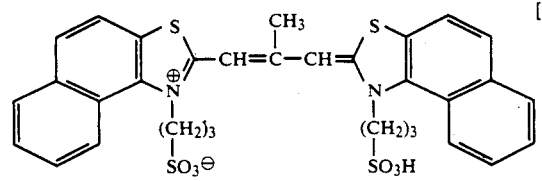
[III-2]

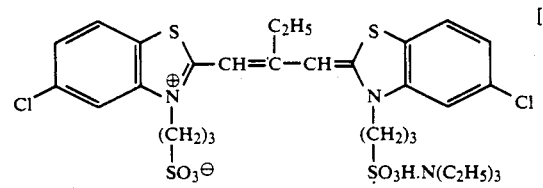
[III-3]

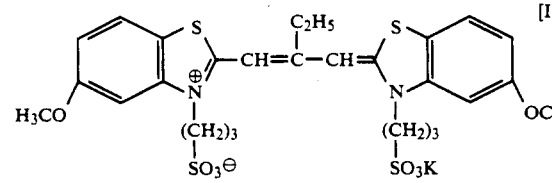
[III-4]

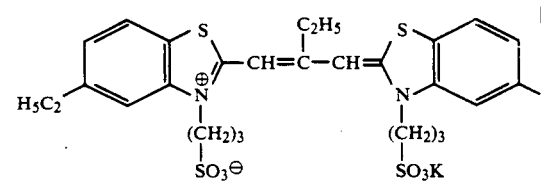
[III-5]

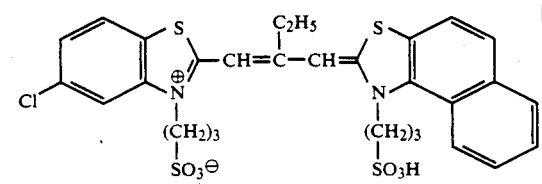
[III-6]

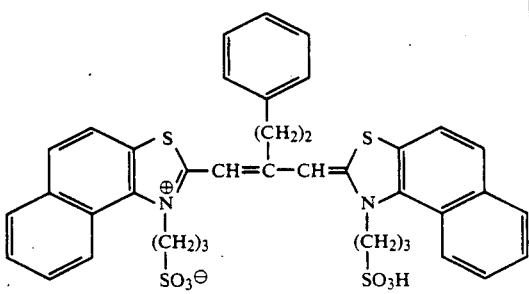
[III-7]

The sensitizing dyes used in this invention can be synthesized by the methods well known to the art. A solution of the combined dyes in a water-miscible organic solvent such as methanol, ethanol, and methyl Cellosolve is added to the emulsion or, alternatively, each solution of single dye is added. Although the sensitizing dye can be added at any stage of emulsion manufacture, it is generally preferred to add at the end of second ripening. The amount added of each dye is from $1 \times 10^{-5}$ to $1 \times 10^{-2}$ mole per mole of silver halide. The proportions of dyes of general formulas I], [II], and [III] are generally 1:0.5–5:0.05–2, preferably 1:1–3:0.1–1 by weight. The optimum amount depends upon the conditions of silver halide emulsion such as, for example, composition of silver halide, average grain size of silver halide, and crystal habit of the grain. The total amount of dyes is preferably $1 \times 10^{-4}$–$1 \times 10^{-1}$ mole per mole of silver halide. The silver halide can be silver chloride, chlorobromide, chloroiodide containing up to 6 mole-% of iodide, or chlorobromoiodide, provided the silver chloride content is 70 mole-% or more. The average grain size of silver halide is in the range of from 0.2 to 0.8 μm, preferably from 0.2 to 0.5 μm, though an emulsion of other average grain sizes can also be used. A monodispersed emulsion, in which the grain sizes of 90% or more of the total number of silver halide grains are within ±30% of the average value, is desirable. The crystal form of the silver halide in the emulsion is preferably cube or tetradecahedron but the grains of other crystal habits may also be used.

The binder generally used in the silver halide emulsion of this invention is gelatin which can be partially replaced by one or more of the hydrophilic polymers such as starch, albumin, sodium alginate, hydroxyethylcellulose, gum arabic, polyvinyl alcohol, polyvinylpyrrolidone, carboxymethylcellulose, polyacrylamide, styrene-maleic anhydride copolymers, and polyvinyl methyl ether-maleic anhydride copolymers. An aqueous dispersion (latex) of vinyl polymers can also be used.

The silver halide emulsion can be sensitized in various ways during its manufacture or coating. As known well to the art, the emulsion is chemically sensitized with, for example, sodium thiosulfate, alkylthioureas, or gold compounds such as, for example, gold rhodanide and gold chloride, or by the joint use of a gold compound and other sensitizing compounds. When a compound of metals of Group VIII of the periodic table, such as, for example, a salt of cobalt, nickel, rhodium, palladium, iridium, or platinum is used at any stage of emulsion manufacture, there is obtained an emulsion excellent in sensitivity, sharpness, and resolving power. The amount added of such a compound is in the range of from $10^{-8}$ to $10^{-3}$ mole per mole of silver halide.

The silver halide emulsion layer can contain common additives such as, for example, coating aid, hardener, antifoggant, matting agent, and developing agent.

Between the emulsion layer and the support, there can be provided a subbing layer to improve adhesion and/or an undercoating layer to prevent halation. These layers can contain a developing agent or a matting agent.

For use in lithography, the photographic element of this invention preferably has as the surface layer an image receptive layer containing physical development nuclei. As the nuclei, use may be made of known substances including metals such as antimony, bithmus, cadmium, cobalt, palladium, nickel, silver, lead, and zinc, and sulfides thereof. Such an image receptive layer may not contain or may contain 0.1 g/m² or less of hydrophilic colloids such as gelatin, carboxymethylcellulose, gum arabic, sodium alginate, hydroxyethylstarch, dextrin, hydroxyethylcellulose, polystyrenesulfonic acid, vinylimidazole-acrylamide copolymer, and polyvinyl alcohol.

For use in finish work (camera-ready art), the image receptive layer is generally provided on a separate support other than the support carrying the above-said photosensitive layer. The image receptive layer in this case contains preferably 0.5 to about 5 g/m² of a hydrophilic colloid.

The supports used in this invention include paper; film materials such as cellulose acetate film, polyvinyl acetal film, polystyrene film, polypropylene film, and polyethylene terephthalate film; composite film materials which are polyester, polypropylene, or polystyrene film covered with polyethylene film; metals, metallized paper sheets, and metal-paper laminates. A paper support coated on one or both sides with α-olefin polymers such as polyethylene is also a useful support. The support materials can be incorporated with an antihalation dye or pigment.

The DTR processing solution used in this invention may contain alkaline substances, e.g. sodium hydroxide, potassium hydroxide, lithium hydroxide, and tribasic sodium phosphate; preservatives, e.g. sulfite salts; silver halide solvents, e.g. thiosulfates, thiocyanates, cyclic imides, thiosalicylic acid, and amines; thickeners such as hydroxyethylcellulose, and carboxymethylcellulose; antifoggants, e.g. potassium bromide, 1-phenyl-5-mercaptotetrazole, and compounds described in Japanese Patent Application "Kokai" (Laid-open) No. 26,201/72; developing agents, e.g. hydroquinone and 1-phenyl-3-phrazolidone; development modifiers, e.g. polyoxyalkylene compounds and onium compounds.

To carry out the DTR process, a developing agent can be incorporated into the silver halide emulsion layer and/or the image receptive layer or other water permeable layers contiguous to said layers, as described in Brit. Patent Nos. 1,000,115, 1,012,476, 1,017,273, and 1,042,477. For the development of such a photographic material, use is made of an "alkaline activator solution" containing no developing agent.

The lithographic printing plate produced according to this invention can be treated with a compound described, for example, in Japanese Patent Publication No. 29,723/73 and U.S. Pat. No. 3,721,539 to make ink receptive or to enhance the ink receptivity. The printing, desensitizing, and dampening are carried out in a customary manner well known to the art.

When the panchromatic photographic element of the binary type according to this invention is used in the photomechanical process, there is directly obtained a positive image of good quality conveniently and at low cost and the element retains a high sensitivity and a high contrast for an extended period of time.

EXAMPLE 1

A matting layer containing powdered silica of 5 μ in average particle size was provided on one side of a subbed polyester film support. On the opposite side, there were provided an antihalation undercoating layer (adjusted to pH 4.0) containing carbon black and 20% by weight (based on photographic grade gelatin) of powdered silica, 7 μm in average particle size, and, coated thereon, a high speed silver halide emulsion layer (adjusted to pH 4.0) which had been chemically sensitized with a gold compound, then spectrally sensitized, and which contained 5% by weight (based on photographic grade gelatin) of powdered silica, 7 μm in average particle size. The gelatin content was 3.0 g/m² in the undercoating layer and 1.0 g/m² in the emulsion layer. The silver halide content of the emulsion layer was 1.0 g/m² in terms of silver nitrate. The undercoating layer and the emulsion layer contained formaldehyde, as a hardener, in an amount of 5.0 mg per g of gelatin. The resulting material was dried and heated at 40° C. for 14 days. The emulsion layer was then overcoated with a nucleus coating composition (polymer: No. 3 acrylamide-imidazole copolymer; hydroquinone content: 0.8 g/m²) described in Example 2 of Japanese Patent Application "Kokai" (Laid-open) No. 21,602/78, and dried to obtain a photographic element for making a lithographic printing plate.

The silver halide in the emulsion was silver iodochloride containing 2 mole-% of silver iodide. The silver halide grains were cubic crystals of 0.3 μm in average size and 90% or more of the total number of grains were within ±30% of the average grain size. After chemical ripening according to the normal methods of gold sensitization and sulfur sensitization, the emulsion was divided into a number of portions. To each portion of the emulsion, was added a solution of the sensitizing dye in methanol or water, as shown in Table 1.

TABLE 1

| Sample No. | Sensitizing dye and amount added ($\times 10^{-5}$ mole per mole of silver halide) | | | | | | | |
|---|---|---|---|---|---|---|---|---|
| 1 | (I-1) | 12 | (I-5) | 12 | (II-1) | 12.5 | (III-1) | 4.2 |
| 2 | (I-1) | 15 | (I-5) | 15 | (II-1) | 13.5 | (III-1) | 14 |
| 3 | (I-1) | 12 | (I-6) | 12 | (II-1) | 12.5 | (III-1) | 4.2 |
| 4 | (I-1) | 15 | (I-6) | 15 | (II-1) | 13.5 | (III-1) | 14 |
| 5 | (I-2) | 12 | (I-7) | 12 | (II-1) | 12.5 | (III-1) | 4.2 |
| 6 | (I-2) | 15 | (I-7) | 15 | (II-1) | 13.5 | (III-1) | 14 |
| 7 | (I-2) | 12 | (I-8) | 12 | (II-4) | 12.5 | (III-2) | 4.2 |
| 8 | (I-2) | 15 | (I-8) | 15 | (II-4) | 13.5 | (III-2) | 14 |
| 9 | (I-3) | 12 | (I-9) | 12 | (II-4) | 12.5 | (III-2) | 4.2 |
| 10 | (I-3) | 15 | (I-9) | 15 | (II-4) | 13.5 | (III-2) | 14 |
| 11 | (I-4) | 12 | (I-10) | 12 | (II-4) | 12.5 | (III-2) | 4.2 |
| 12 | (I-4) | 15 | (I-10) | 15 | (II-4) | 13.5 | (III-2) | 14 |
| 13 | (I-4) | 12 | (I-11) | 12 | (II-4) | 12.5 | (III-1) | 4.2 |
| 14 | (I-4) | 15 | (I-11) | 15 | (II-4) | 13.5 | (III-1) | 14 |
| 15 | (I-A) | 24 | — | | (II-4) | 13.5 | (III-2) | 14 |
| 16 | (I-A) | 30 | — | | (II-4) | 13.5 | (III-2) | 14 |

TABLE 1-continued

| Sample No. | Sensitizing dye and amount added ($\times 10^{-5}$ mole per mole of silver halide) | | | | | |
|---|---|---|---|---|---|---|
| 17 | (I-B) | 30 | — | (II-4) 13.5 | (III-2) | 14 |
| 18 | (I-C) | 30 | — | (II-4) 13.5 | (III-2) | 14 |
| 19 | (I-D) | 30 | — | (II-4) 13.5 | (III-2) | 14 |
| 20 | (I-E) | 30 | — | (II-4) 13.5 | (III-2) | 14 |
| 21 | (I-F) | 30 | — | (II-4) 13.5 | (III-2) | 14 |
| 22 | (I-G) | 30 | — | (II-4) 13.5 | (III-2) | 14 |
| 23 | (I-H) | 30 | — | (II-4) 13.5 | (III-2) | 14 |
| 24 | (I-I) | 24 | — | (II-4) 13.5 | (III-2) | 14 |
| 25 | (I-I) | 30 | — | (II-4) 13.5 | (III-2) | 14 |
| 26 | (I-J) | 30 | — | (II-4) 13.5 | (III-2) | 14 |
| 27 | (I-K) | 30 | — | (II-4) 13.5 | (III-2) | 14 |
| 28 | (I-A) | 12 | (I-C) 12 | (II-A) 12.5 | (III-A) | 4.2 |
| 29 | (I-A) | 15 | (I-C) 15 | (II-A) 13.5 | (III-A) | 14 |
| 30 | (I-A) | 15 | (I-C) 15 | (II-B) 13.5 | (III-B) | 14 |
| 31 | (I-B) | 15 | (I-C) 12 | (II-C) 12.5 | (III-C) | 4.2 |

The sensitizing dyes (II) and (III) in Table 1 were as shown below.

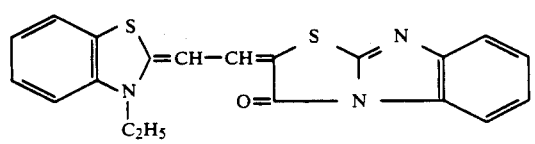

[II-A]

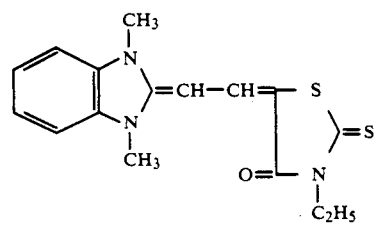

[II-B]

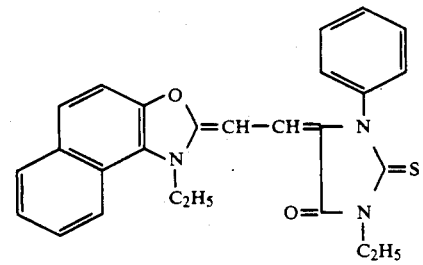

[II-C]

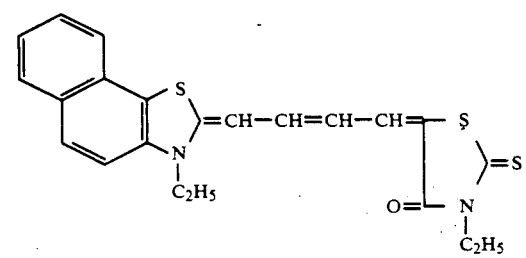

[III-A]

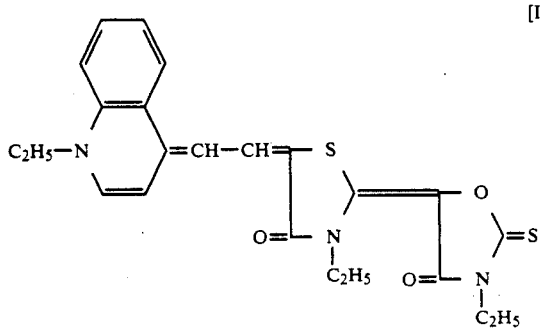

[III-B]

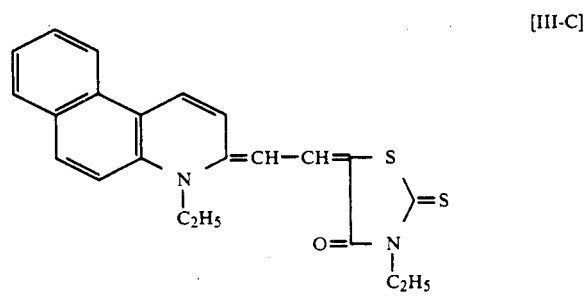

[III-C]

Each of the 31 samples was cut to several pieces to test (1) spectral sensitivity, (2) spectrogram, and (3) printing characteristics. Using a sensitometer provided with a light source of a color temperature of 2666° K., the first group of samples were exposed wedge-wise to the light source through blue (Wratten No. 47B), green (Wratten No. 58), or red (Wratten No. 25) filter of Eastman Kodak Co. Using a spectrograph of the diffraction grating type, provided with a tungsten light source of a color temperature of 2666° K., another group of samples were tested for their spectrograms. The third group of 31 samples were tested for printing characteristics by using a camera processor CP-404-II (Dainippon Screen Co.) for making lithographic printing plate in which Halftone Offset masters for each of the separated colors were prepared by using Wratten filters of blue, green, red, and amber for color separation and gray contact screen (Dainippon Screen Co.). The development after the exposure was performed by using the following diffusion transfer developer.

| Transfer developer: | |
|---|---|
| Water | 700 ml |
| Potassium hydroxide | 20 g |
| Sodium sulfite, anhydrous | 50 g |
| 2-Mercaptobenzoic acid | 1.5 g |
| 2-Methylaminoethanol | 15 g |
| Made up with water to | 1 liter |

After development, the photographic element was passed through a pair of squeezing rolls to remove the excess developer and immediately treated with a neutralizer of the following composition at 25° C. for 20 seconds. The element was passed through squeezing rolls to remove the excess neutralizer and dried at room temperature.

| Neutralizer: | |
|---|---|
| Water | 600 ml |
| Citric acid | 10 g |
| Sodium citrate | 35 g |

-continued

| Neutralizer: | |
|---|---|
| Colloidal silica, 20% solution | 5 ml |
| Ethylene glycol | 5 ml |
| Made up with water to | 1 liter |

The spectral sensitivity was determined by measuring the reflection density by means of a densitometer of Macbeth Co. The blue filter sensitivity (SB), green filter sensitivity (SG), red filer sensitivity (SR), and Y were as shown in Table 2, wherein the sensitivity was expressed in relative value by assuming the red sensitivity of sample No.1 to be 100. In Table 3 are shown the sharpness, resolving power, and printing endurance of 4 offset masters (cyan plate, magenta plate, yellow plate, and black plate) for each sample (sensitivities were omitted because their values were the same as shown in Table 2).

The sharpness and resolving power were evaluated by using gray contact screens of 100, 133, 150, 175, and 200 lines/inch and noting the number of rulings of the contact screen when a tiny dot (5% dot) was solidly and clearly reproduced. The results of evaluation were expressed in 5 grades from 1 (100 lines/in) to 5 (200 lines/in.).

The lithographic printing plate made by using contact screen, of which the results of evaluation of resolving power were shown in Table 3, were mounted on an offset press, then a desensitizing solution (etch solution) of the following composition was fed thoroughly all over the plate, and the press was run using a dampening solution of the composition as shown below.

| Desensitizing solution: | |
|---|---|
| Water | 600 ml |
| Isopropyl alcohol | 400 ml |
| Ethylene glycol | 50 g |
| 3-Mercapto-4-acetamido-5-n-heptyl-1,2,4-triazole | 1 g |
| Dampening solution: | |
| Orthophosphoric acid | 10 g |
| Nickel nitrate | 5 g |
| Sodium sulfite | 5 g |
| Ethylene glycol | 100 g |
| Colloidal silica (20% solution) | 28 g |
| Made up with water to | 2 liter |

The printing press used was A.B. Dick 3500D (Trademark for an offset press made by A.B. Dick Co.). The priting endurance of the printing plate was evaluated by the number of copies obtained until the printing had been discontinued due to scumming or partial disappearance of silver image. The results of evaluation were expressed in 5 grades from 1 to 5 according to the following criteria;

| Number of copies |
|---|
| 1: $\leq 4,000$ |
| 2: 4,000 to 6,000 |
| 3: 6,000 to 8,000 |
| 4: 8,000 to 10,000 |
| 5: $\geq 10,000$ |

TABLE 2

| Sample No. | Red SR | $\gamma$ | Green SG | $\gamma$ | Blue SB | $\gamma$ |
|---|---|---|---|---|---|---|
| 1 | 100 | 2.6 | 75 | 2.5 | 20 | 2.1 |
| 2 | 110 | 3.0 | 80 | 3.0 | 25 | 2.6 |
| 3 | 100 | 2.6 | 80 | 2.3 | 22 | 2.0 |
| 4 | 110 | 3.0 | 85 | 2.9 | 27 | 2.5 |
| 5 | 100 | 2.8 | 76 | 2.5 | 21 | 2.3 |
| 6 | 110 | 3.0 | 81 | 2.9 | 26 | 2.5 |
| 7 | 100 | 2.7 | 75 | 2.5 | 22 | 2.4 |
| 8 | 110 | 3.1 | 80 | 2.8 | 26 | 2.6 |
| 9 | 100 | 2.6 | 75 | 2.6 | 21 | 2.5 |
| 10 | 110 | 2.7 | 82 | 2.7 | 27 | 2.7 |
| 11 | 100 | 2.5 | 76 | 2.3 | 25 | 2.3 |
| 12 | 110 | 2.6 | 85 | 2.5 | 27 | 2.6 |
| 13 | 100 | 2.6 | 76 | 2.3 | 25 | 2.1 |
| 14 | 110 | 3.0 | 81 | 2.8 | 27 | 2.6 |
| 15 | 45 | 1.0 | 48 | 1.0 | 14 | 1.3 |
| 16 | 42 | 0.9 | 46 | 1.0 | 15 | 1.5 |
| 17 | 40 | 0.9 | 45 | 0.9 | 17 | 1.5 |
| 18 | 47 | 1.1 | 51 | 1.2 | 10 | 1.0 |
| 19 | 83 | 2.5 | 79 | 2.3 | 4 | 0.7 |
| 20 | 88 | 2.6 | 81 | 2.3 | 6 | 0.7 |
| 21 | 90 | 2.7 | 84 | 2.4 | 7 | 0.9 |
| 22 | 90 | 2.6 | 83 | 2.4 | 4 | 0.7 |
| 23 | 86 | 2.6 | 80 | 2.3 | 6 | 0.8 |
| 24 | 86 | 2.6 | 80 | 2.3 | 9 | 1.1 |
| 25 | 89 | 2.6 | 80 | 2.3 | 10 | 1.1 |
| 26 | 93 | 2.7 | 82 | 2.3 | 5 | 0.7 |
| 27 | 88 | 2.7 | 80 | 2.3 | 11 | 1.2 |
| 28 | 80 | 1.3 | 65 | 1.3 | 10 | 1.2 |
| 29 | 85 | 1.5 | 60 | 1.4 | 12 | 1.3 |
| 30 | 83 | 1.4 | 65 | 1.5 | 10 | 1.2 |
| 31 | 85 | 1.4 | 60 | 1.3 | 11 | 1.1 |

TABLE 3

| Sample No. | Resolving power | | | | Printing endurance | | | |
|---|---|---|---|---|---|---|---|---|
| | Cyan plate | Magenta plate | Yellow plate | Black plate | Cyan plate | Magenta plate | Yellow plate | Black plate |
| 1 | 5 | 5 | 5 | 5 | 5 | 5 | 5 | 5 |
| 2 | 5 | 5 | 5 | 5 | 5 | 5 | 5 | 5 |
| 4 | 5 | 5 | 5 | 5 | 5 | 5 | 5 | 5 |
| 6 | 5 | 5 | 5 | 5 | 5 | 5 | 5 | 5 |
| 8 | 5 | 5 | 5 | 5 | 5 | 5 | 5 | 5 |
| 10 | 5 | 5 | 5 | 5 | 5 | 5 | 5 | 5 |
| 12 | 5 | 5 | 5 | 5 | 5 | 5 | 5 | 5 |
| 14 | 5 | 5 | 5 | 5 | 5 | 5 | 5 | 5 |
| 15 | 3 | 3 | 2 | 2 | 3 | 3 | 3 | 3 |
| 16 | 3 | 3 | 2 | 2 | 3 | 3 | 3 | 3 |
| 17 | 3 | 3 | 2 | 2 | 3 | 3 | 3 | 3 |
| 18 | 3 | 3 | 2 | 2 | 3 | 3 | 3 | 3 |
| 19 | 5 | 5 | 3 | 3 | 5 | 5 | 3 | 4 |
| 20 | 5 | 5 | 3 | 3 | 5 | 5 | 3 | 4 |
| 21 | 5 | 5 | 3 | 3 | 5 | 5 | 3 | 4 |
| 22 | 5 | 5 | 3 | 3 | 5 | 5 | 3 | 4 |
| 23 | 5 | 5 | 3 | 3 | 5 | 5 | 3 | 4 |
| 25 | 5 | 5 | 3 | 3 | 5 | 5 | 3 | 4 |

TABLE 3-continued

| Sample No. | Resolving power | | | | Printing endurance | | | |
|---|---|---|---|---|---|---|---|---|
| | Cyan plate | Magenta plate | Yellow plate | Black plate | Cyan plate | Magenta plate | Yellow plate | Black plate |
| 26 | 5 | 5 | 3 | 3 | 5 | 5 | 3 | 4 |
| 27 | 5 | 5 | 3 | 3 | 5 | 5 | 3 | 4 |
| 29 | 3 | 3 | 2 | 2 | 2 | 2 | 2 | 2 |
| 30 | 3 | 3 | 2 | 3 | 2 | 2 | 2 | 3 |
| 31 | 3 | 3 | 2 | 2 | 2 | 2 | 2 | 2 |

As is understandable from the results shown in Tables 2 and 3, as compared with reference samples (Nos. 15 to 31), the samples (Nos. 1 to 14) according to this invention are superior in sensitivities to red, green, and blue, as well as in contrast, resolving power, and printing endurance, indicating the superiority of sensitizing dyes of the present invention. From the spectrograms, it was found that the sensitizing dyes corresponding to three colors had simultaneously adsorbed to each grains of silver halide in the emulsion layer according to this invention.

EXAMPLE 2

Samples shown in Table 4 were prepared in the same manner as in Example 1, except that the silver iodide content and silver bromide content of the silver halide were 2 mole-% and 8 mole-%, respectively, to increase the inherent sensitivity of silver halide. The results of DTR development were as shown in Table 5.

TABLE 4

| Sample No. | Sensitizing dye and amount added. ($\times 10^{-5}$ mole/mole silver halide) | | |
|---|---|---|---|
| 32 | (I-3) 24 | (II-1) 12.5 | (III-1) 4.2 |
| 33 | (I-4) 24 | (II-1) 12.5 | (III-1) 4.2 |
| 34 | (I-5) 24 | (II-1) 12.5 | (III-1) 4.2 |
| 35 | (I-6) 24 | (II-1) 12.5 | (III-2) 4.2 |
| 36 | (I-7) 24 | (II-4) 12.5 | (III-2) 4.2 |
| 37 | (I-8) 24 | (II-4) 12.5 | (III-2) 4.2 |
| 33 | (I-9) 24 | (II-4) 12.5 | (III-2) 4.2 |

TABLE 5

| Sample No. | Red | | Green | | Blue | |
|---|---|---|---|---|---|---|
| | SR | $\gamma$ | SG | $\gamma$ | SB | $\gamma$ |
| 32 | 110 | 2.4 | 80 | 2.3 | 30 | 2.0 |
| 33 | 110 | 2.3 | 85 | 2.0 | 25 | 2.0 |
| 34 | 110 | 2.3 | 80 | 2.0 | 25 | 2.0 |
| 35 | 100 | 2.5 | 85 | 2.3 | 35 | 2.0 |
| 36 | 100 | 2.5 | 85 | 2.3 | 35 | 2.0 |
| 37 | 100 | 2.4 | 85 | 2.3 | 35 | 2.0 |
| 38 | 100 | 2.3 | 85 | 2.2 | 20 | 2.0 |

Note:
The sensitivity is expressed in relative value, assuming the red sensitivity of sample No. 1 in Example 1 to be 100.

In the same manner as in Example 1, samples were tested for resolving power and printing endurance. The results of evaluation were grade 5 for each of the cyan, magenta, yellow, and black plates.

EXAMPLE 3

The samples of photographic elements obtained in Example 1 according to this invention were left standing under atmospheric conditions. After one month, the samples were tested in the same manner as in Example 1. It was found that substantially no change was observed in photographic and printing characteristics, indicating the excellent stability of the photographic elements according to this invention.

EXAMPLE 4

An emulsion of silver iodochloride containing 2 mole-% of silver iodide and having an average grain size of 0.3 μ was chemically sensitized with gold and sulfur in a customary manner. The emulsion was divided into several portions. To each portion, was added respectively a methanol or aqueous solution of one of the same sensitizing dyes of this invention or reference dyes as used in Example 1. To some portions of the emulsion, was added a combination of sensitizing dye solutions. The emulsion was thoroughly stirred at about 50° C. to stabilize the spectral sensitization. Thereafter, to each portion of the emulsion, were added suitable amounts of hydroquinone, 1-phenyl-5-mercaptotetrazole, formaldehyde as hardener, and coating aids. The resulting emulsion was coated on a subbed support of polyester film. After drying there were obtained samples of light-sensitive elements of the panchromatic type. Each sample was cut into several pieces to be used in several tests.

Using a sensitometer provided with a light source of a color temperature of 2666° K., a group of samples were exposed wedge-wise to the light source through blue (Wratten No. 47B), green (Wratten No. 58), or red (Wratten No. 25) filter of Estman Kodak Co. using a spectrograph of the diffraction grating type, provided with a tungsten light source of a color temperature of 2666° K., another group of samples were tested for their spectrograms.

A paper support, 100 g/m² in basis weight, coated on both sides with 15 g/m² of polyethylene was used as non-photosensitive image receptive material. After corona treatment, the coated paper support was coated with the following composition at a coverage of 18 m²/liter.

| | |
|---|---|
| Carboxymethylcellulose | 12 g |
| Gelatin | 45 g |
| Palladium sulfide nucleating agent (an aqueous suspension containing 2% by weight of gelatin and 0.6% by weight of palladium sulfide) | 7 ml |
| Made up with water to | 1000 ml |

The sample of photosensitive material of the panchromatic type was exposed and the emulsion side of the exposed sample was brought into contact with the image receptive side of the image receptive material and the assembly was passed through an ordinary DTR processor containing a developer of the following composition.

| | |
|---|---|
| Water | 800 ml |
| Tribasic sodium phosphate, dodecahydrate | 75 g |
| Sodium sulfite, anhydrous | 40 g |
| Potassium bromide | 0.5 g |

| -continued | |
|---|---|
| Sodium thiosulfate, anhydrous | 20 g |
| 1-Phenyl-5-mercaptotetrazole | 70 mg |
| Made up with water to | 1000 ml |

After having emerged from the squeezing rolls of DTR processor, the photosensitive material and the image receptive material in close contact were kept as such for 90 seconds and then pulled apart. The reflection density of the image receptive material was measured by means of a densitometer of Macbeth Co. to obtain blue filter sensitivity (SB), green filter sensitivity (SG), red filter sensitivity (SR), and $\gamma$. The results obtained were nearly the same as in Example 1.

What is claimed is:

1. A method of printing comprising printing with lithographic printing plates which have been prepared by employing a silver complex diffusion transfer process which comprises (i) subjecting to blue, green, red and amber exposure four panchromatic light-sensitive materials which comprise a support and, provided thereon, a silver halide emulsion layer and a surface physical development nuclei layer, said emulsion layer comprising at least 70 mole % of silver chloride and being optically sensitized to blue, green and red spectral regions, and said emulsion containing (a) at least one of the blue-sensitizing dyes represented by the general formula (I):

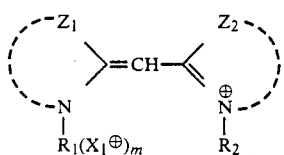

wherein $Z_1$ represents a group of atoms necessary for completing benzothiazole nucleus, benzoxazole nucleus, or benzoselenazole nucleus having a substituent at position 5 and/or 6; $Z_2$ represents a group of atoms necessary for completing a naphthothiazole nucleus, naphthoselenazole nucleus, or naphthoxazole nucleus, provided that $Z_1$ and $Z_2$ do not simultaneously form a benzoxazole nucleus and naphthosazole nucleus, respectively; $R_1$ and $R_2$ represent each a substituted or unsubstituted aliphatic group, at least one of $R_1$ and $R_2$ representing an aliphatic group having a sulfo group; $X_1$ represents a cation; and m represents 0 and 1;

(b) at least one of the sensitizing dye represented by the following general formula (II):

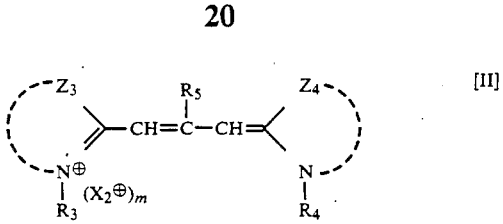

wherein $Z_3$ and $Z_4$ represent groups of atoms necessary to complete benzoxazole nucleus or naphthoxazole nucleus; $R_3$ and $R_4$ represent each a substituted or unsubstituted aliphatic or aromatic group, at lest one of $R_3$ and $R_4$ being a group having a sulfo group; $R_5$ represents a hydrogen atom, alkyl group, aryl group, or aralkyl group; $X_2$ represents a cation; and m represent 0 or 1; and (c) at least one of the sensitizing dye represented by the following general formula (III):

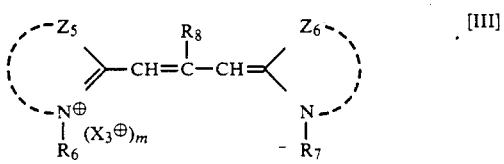

wherein $Z_5$ and $Z_6$ each represents a group of atoms necessary to complete a benzothiazole nucleus, benzoselenazole nucleus, naphthothiazole nucleus, or naphthoselenazole nucleus; $R_6$ and $R_7$ represent each an unsubstituted or substituted aliphatic group or aromatic group, at least one of $R_6$ and $R_7$ being a group having a sulfo group; $R_8$ represents a hydrogen atom, an alkyl group, aryl group, or aralkyl group; $X_3$ represents a cation; and m represents 0 or 1; as green- and red-sensitizing dyes; and (ii) diffusion transfer developing the exposed material in the presence of a silver halide solvent;

to obtain yellow, magneta, cyan and black plates; and (iii) printing using blue, green, red and black ink on the printing plates prepared by subjecting the four panchromatic light-sensitive materials to blue, green, red and amber light exposures, respectively.

2. Process according to claim 1 wherein the substituent at position 5 and/or 6 of the nucleus involving $Z_1$ is an alkyl group, an alkoxy group, a halogen atom, an aryl group, cyano group, an alkoxy carbonyl group, a carboxyl group or heterocyclic group.

3. A method according to claim 1 wherein the amount of the blue-sensitizing dye, is $1 \times 10^{-5}$ to $1 \times 10^{-2}$ mole per mole of silver halide.

4. Method according to claim 1 wherein the amount of each of the sensitizing dye, and is $1 \times 10^{-5}$ to $1 \times 10^{-2}$ mole per mole of silver halide.

5. Process according to claim 4 wherein the total amount of the sensitizing dye and the sensitizing dye and/or the sensitizing dye is $1 \times 10^{-4}$ to $1 \times 10^{-1}$ mole per mole of silver halide.

6. Process according to claim 1 wherein the proportion of the dyes, and is 1:0.5-5:0.05-2.

7. Process according to claim 1 wherein the panchromatic light-sensitive material ha a subbing layer and/or under-coating layer between the emulsion layer and the support.

* * * * *